(12) United States Patent
Lin et al.

(10) Patent No.: US 8,035,899 B2
(45) Date of Patent: Oct. 11, 2011

(54) LENS ASSEMBLY

(76) Inventors: Yi-Jie Lin, Taichung (TW); Yen-Wei Ho, Taichung (TW)

( * ) Notice: Subject to any disclaimer, the term of this patent is extended or adjusted under 35 U.S.C. 154(b) by 0 days.

(21) Appl. No.: 12/656,379

(22) Filed: Jan. 28, 2010

(65) Prior Publication Data
US 2011/0134536 A1    Jun. 9, 2011

(30) Foreign Application Priority Data
Dec. 4, 2009    (TW) ................................ 98222810 U

(51) Int. Cl.
*G02B 3/00* (2006.01)
*F21V 9/00* (2006.01)
(52) U.S. Cl. ........................................ 359/649; 362/335
(58) Field of Classification Search .................. 359/642, 359/649; 362/335, 546, 549
See application file for complete search history.

(56) References Cited

U.S. PATENT DOCUMENTS

| 5,947,588 A * | 9/1999 | Huang | 362/549 |
| 2010/0073938 A1* | 3/2010 | Ho | 362/335 |

* cited by examiner

*Primary Examiner* — Alicia M Harrington
(74) *Attorney, Agent, or Firm* — Raymond Y. Chan; David and Raymond Patent Firm

(57) ABSTRACT

A lens assembly includes a platform having an incident surface and a projection surface on opposite surfaces thereof. Wire holes are formed to the bottom side along a longer axis of the incident surface for wiring. A cut is formed around the incident surface for receiving waterproof ring. The incident surface has a main oval-shaped concave surface. Two symmetric oval-shaped lateral concave surfaces are formed to front two lateral sides of the main oval-shaped concave surface. The projection surface is formed by a plurality of continuous oval-shaped convex surfaces and discontinuous oval-shaped convex surfaces. Two symmetric vertical planes are formed to two lateral sides of the projection surface. The lens assembly capable of receiving LED larger than 10 mm has good distribution of a transverse maximum intensity of light occurring between ±50 to ±60 degrees and a vertical maximum intensity of light occurring between ±30 to ±40 degrees.

9 Claims, 10 Drawing Sheets

LENS ASSEMBLY

FIELD OF THE INVENTION

The present invention relates to lens assembly, and particular to a lens assembly capable of receiving 10 mm LED or larger.

DESCRIPTION OF THE PRIOR ART

According to a previous invention of application no. 098139956, an optic lens assembly includes a platform having an incident surface and a projection surface on two opposite sides of the platform. The incident surface and the projection surface are formed by a plurality of curved surfaces respectively.

The incident surface consists of a first oval-shaped incident surface and a second oval-shaped incident surface formed side by side. The projection surface also consists of a first oval-shaped projection surface and a second oval-shaped projection surface formed side by side and two symmetric outer connecting surfaces formed to two lateral sides of the projection surface.

When a Light Emitting Diode with an illuminating angle between 90 to 135 degrees defined by a Full Width at Half Maximum (FWHM) is used as an illumination source, a maximum intensity of illumination above 300 cd/klm at a perpendicular angle of 60 degrees and vertical angle between 65 to 95 degrees will occur.

Through above invention, the research team keeps developing and designing for a better product so that the present invention has all the advantages of the previous invention. In additional, a cut for waterproof ring is formed for a watertight feature. The present invention also has good distribution of a transverse maximum intensity of light occurring between ±50 to ±60 degrees and a vertical maximum intensity of light occurring between ±30 to ±40 degrees.

SUMMARY OF THE PRESENT INVENTION

Accordingly, the primary object of the present invention is to provide a lens assembly has the following features.

1. The lens assembly is capable of receiving LED larger than 10 mm. The lens assembly has a cut for receiving waterproof ring so as to be watertight.

2. The lens assembly also has good light distribution of the maximum intensity of light occurring between ±50 to ±60 degrees along a shorter axis and the maximum intensity of light occurring between ±30 to ±40 degrees along a longer axis. The shorter axis is parallel to the road and the longer axis will improve a uniformity of light across the road while the lens assembly is arranged on a side of the road.

3. A wire hole is formed to the lens assembly for wiring of LED. To achieve above object, the present invention provide a lens assembly including the following components.

A platform has an incident surface. The incident surface has a main oval-shaped concave surface. Two symmetric oval-shaped lateral concave surfaces are formed to front two lateral sides of the main oval-shaped concave surface. Wire holes are formed to a bottom side along a longer axis of the incident surface for wiring. A cut is formed around the incident surface for receiving waterproof ring.

A projection surface is formed to relative outer side of the platform against the incident surface. The projection surface formed by a plurality of a plurality of continuous oval-shaped convex surfaces and discontinuous oval-shaped convex surfaces can cover the whole incident surface. The projection surface is symmetric across the longer axis of the incident surface and is asymmetric across a shorter axis of the incident surface. Two symmetric vertical planes are formed to two lateral sides of the projection surface.

A lens assembly having main effect of the present invention is thus formed.

DETAILED DESCRIPTION OF THE IVENTION

Figure 1:
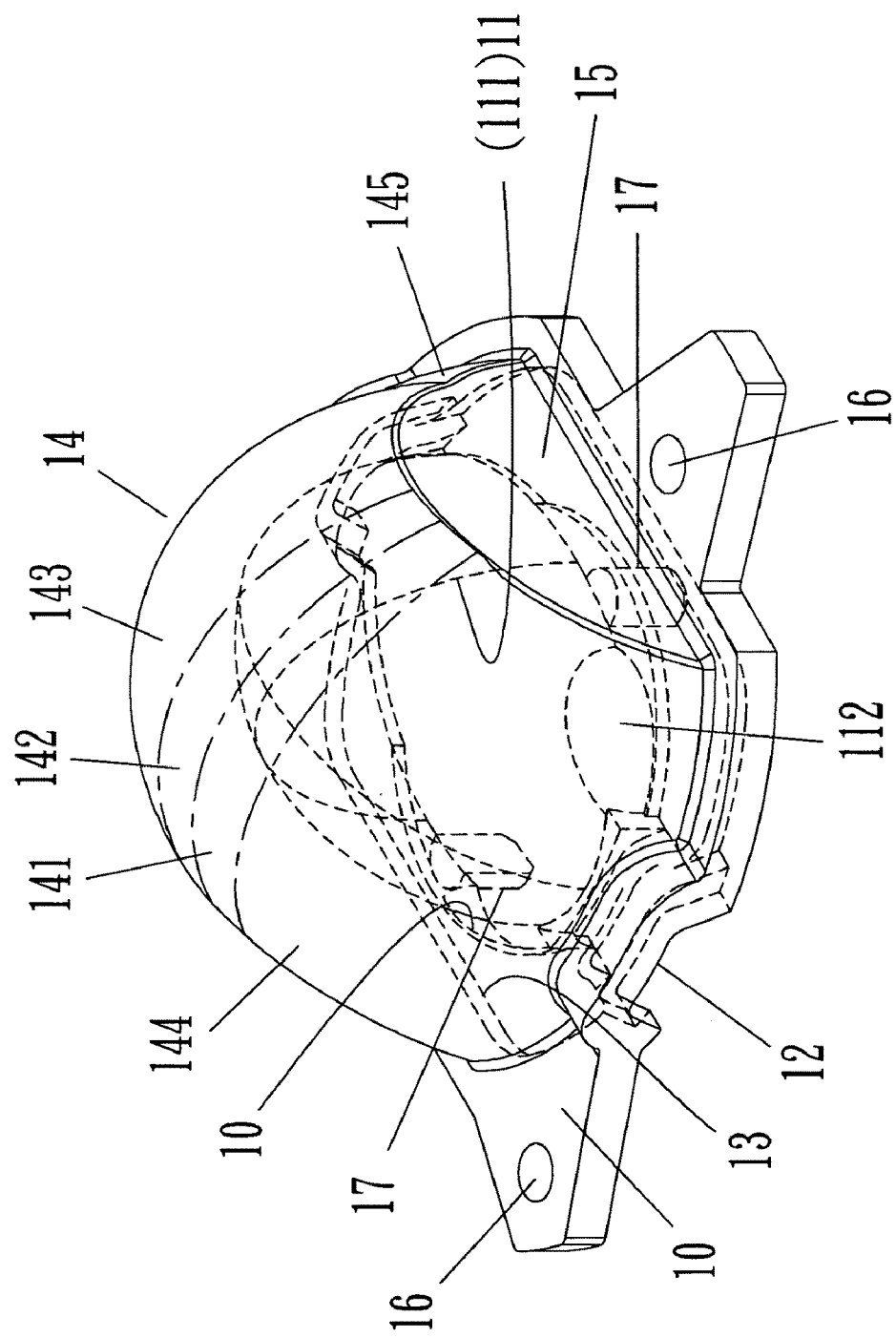
FIG. 1 is an isogonal prospective view of a preferable embodiment of the present invention.

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

An embodiment of a lens assembly is shown in FIGS. 1 to 10.

The lens assembly has a platform 10, an incident surface 11 is formed to a bottom side of the platform 10. Over 90% of the incident surface 11 is a main oval-shaped concave surface 111. Two symmetric oval-shaped concave surfaces 112 are formed to front two lateral sides of the main oval-shaped concave surface 111 as shown in FIGS. 4, 8, 9, 10. Two wire holes 12 are formed to the bottom side along a longer axis of the incident surface 11 for wiring (not shown). Besides, a cut 13 is formed around the incident surface 11 for receiving waterproof ring (not shown).

A projection surface 14 is formed to relative outer side of the platform against the incident surface 11. The projection surface 14 can cover the whole incident surface 11. The projection surface 14 has three adjacent continuous oval-shaped convex surfaces 141, 142, and 143 formed side by side on a center area of the projection surface 14. An oval-shaped convex surface 144 is formed beside the oval-shaped convex surfaces 141 discontinuously. An oval-shaped convex surface 145 is formed beside the oval-shaped convex surface 143 discontinuously. The projection surface 14 is symmetric across the longer axis (a line L in FIG. 2, the longer axis is regarded as Y direction) of the incident surface 11. The projection surface 14 is asymmetric across a shorter axis (a line W in FIG. 2, the shorter axis is regarded as X direction) of the incident surface 11.

Two symmetric vertical planes 15 are formed to two sides of the projection surface 14.

The waterproof ring can be arranged to an internal side of the lens assembly so as to improve a watertight ability of the lens assembly. The lens assembly also has good light distribution of the maximum intensity of light occurring between ±50 to ±60 degrees along the shorter axis and the maximum intensity of light occurring between ±30 to ±40 degrees along the longer axis.

Therefore, the shorter axis is parallel to the road and the longer axis will improve a uniformity of light across the road while the lens assembly is arranged on a side of the road.

Moreover, the lens assembly has a through hole on a predetermined position of the bottom side of the lens assembly for power code. A plurality of retaining holes 16 on a rim of the platform and symmetric retaining feet 17 formed to predetermined position of the bottom of the platform 10 are arranged for installation.

Figure 2:
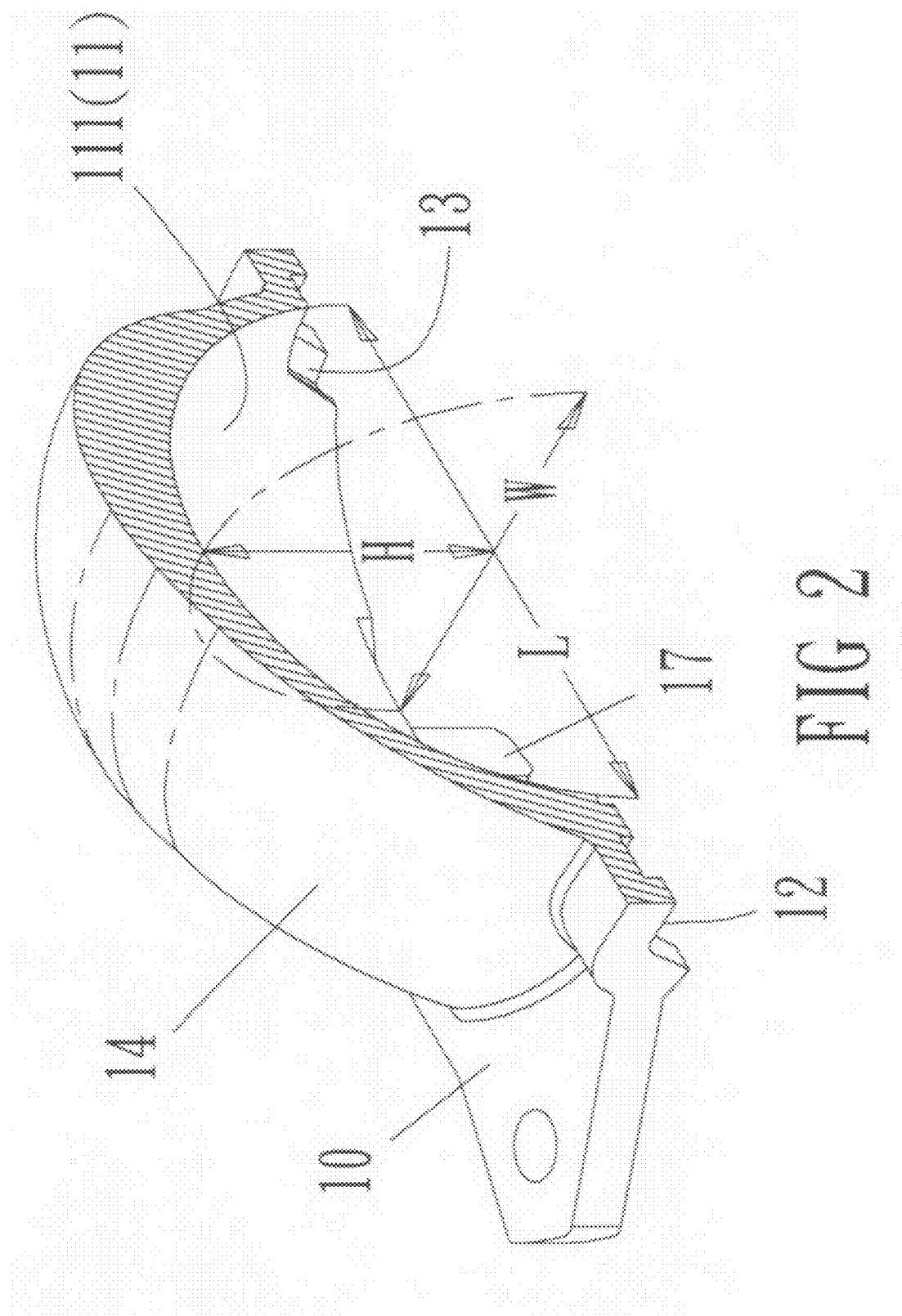
FIG. 2 is an isogonal cross section view of the FIG. 1.
Figure 3:
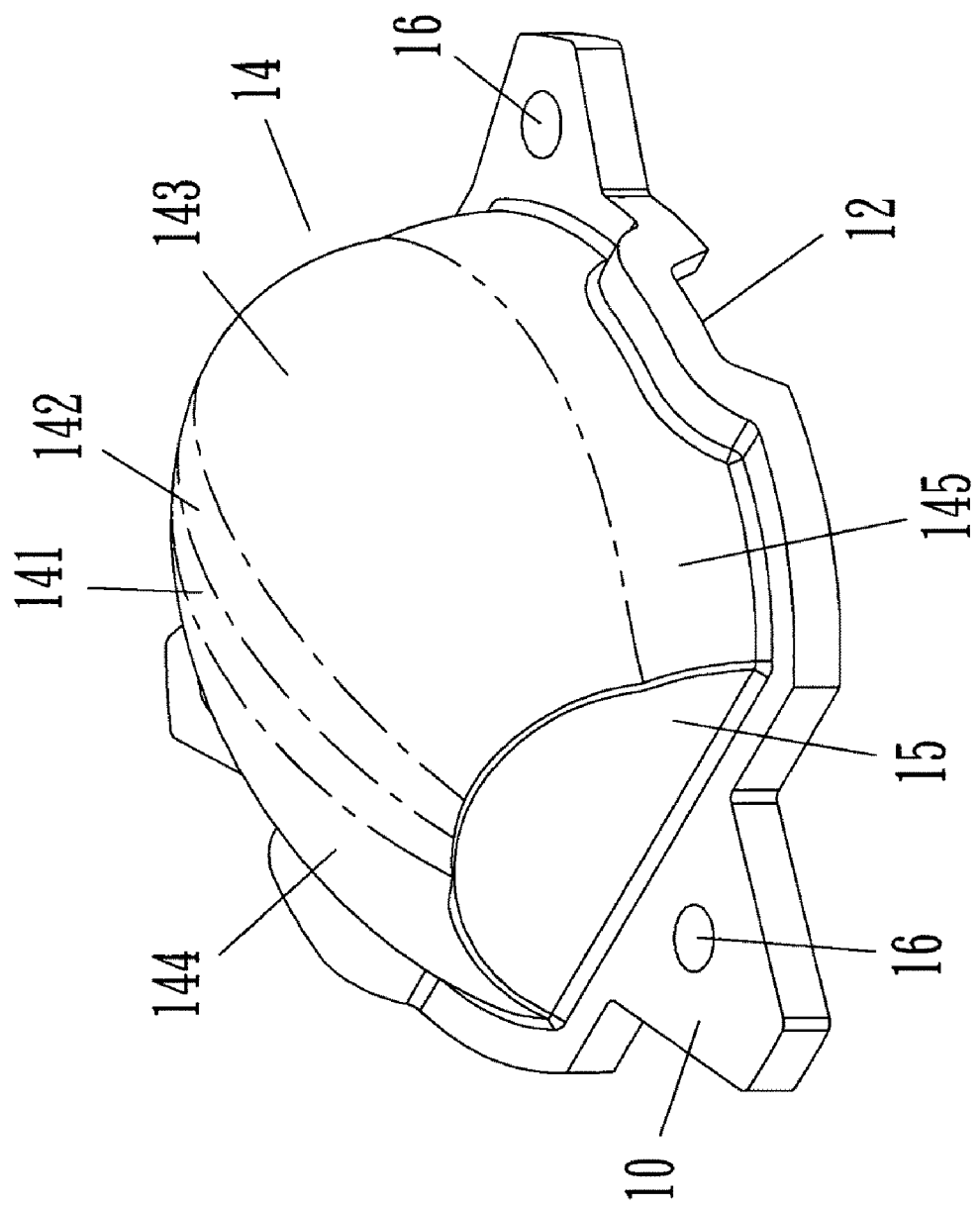
FIG. 3 is a rear isogonal schematic view of the preferable embodiment of the present invention.
Figure 4:
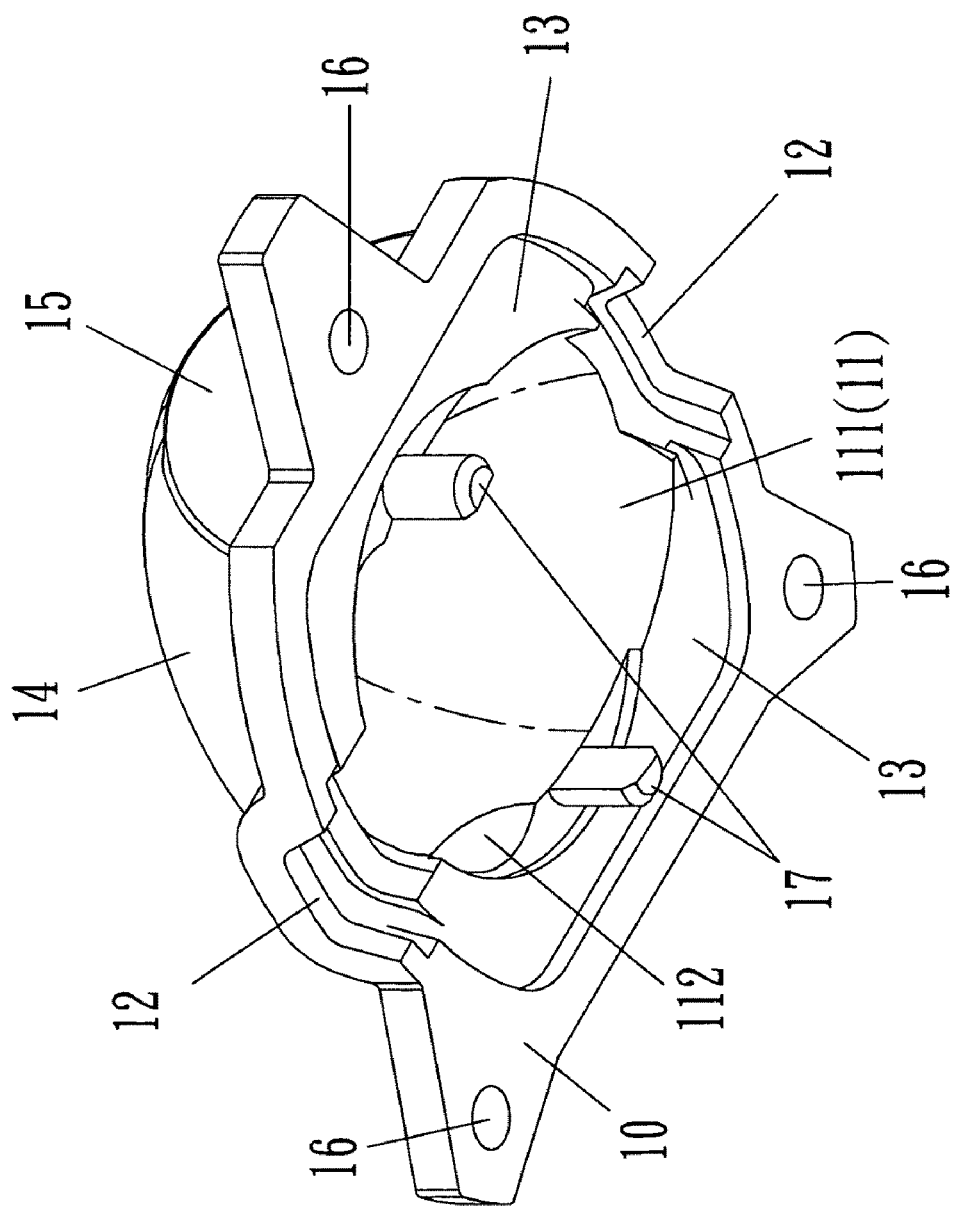
FIG. 4 is an upward view of the FIG. 1.
Figure 5:
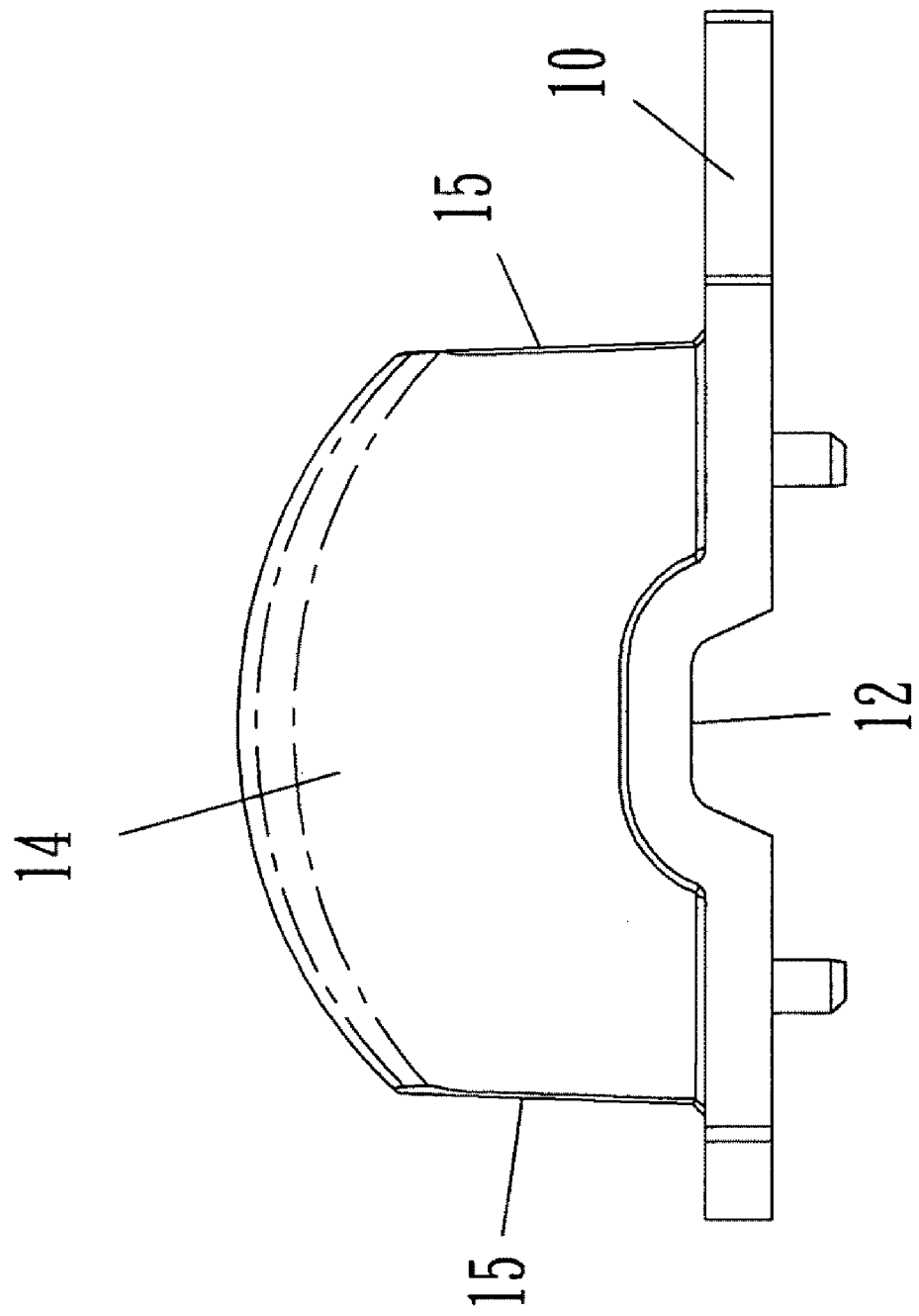
FIG. 5 is a front view of the preferable embodiment of the present invention.
Figure 6:
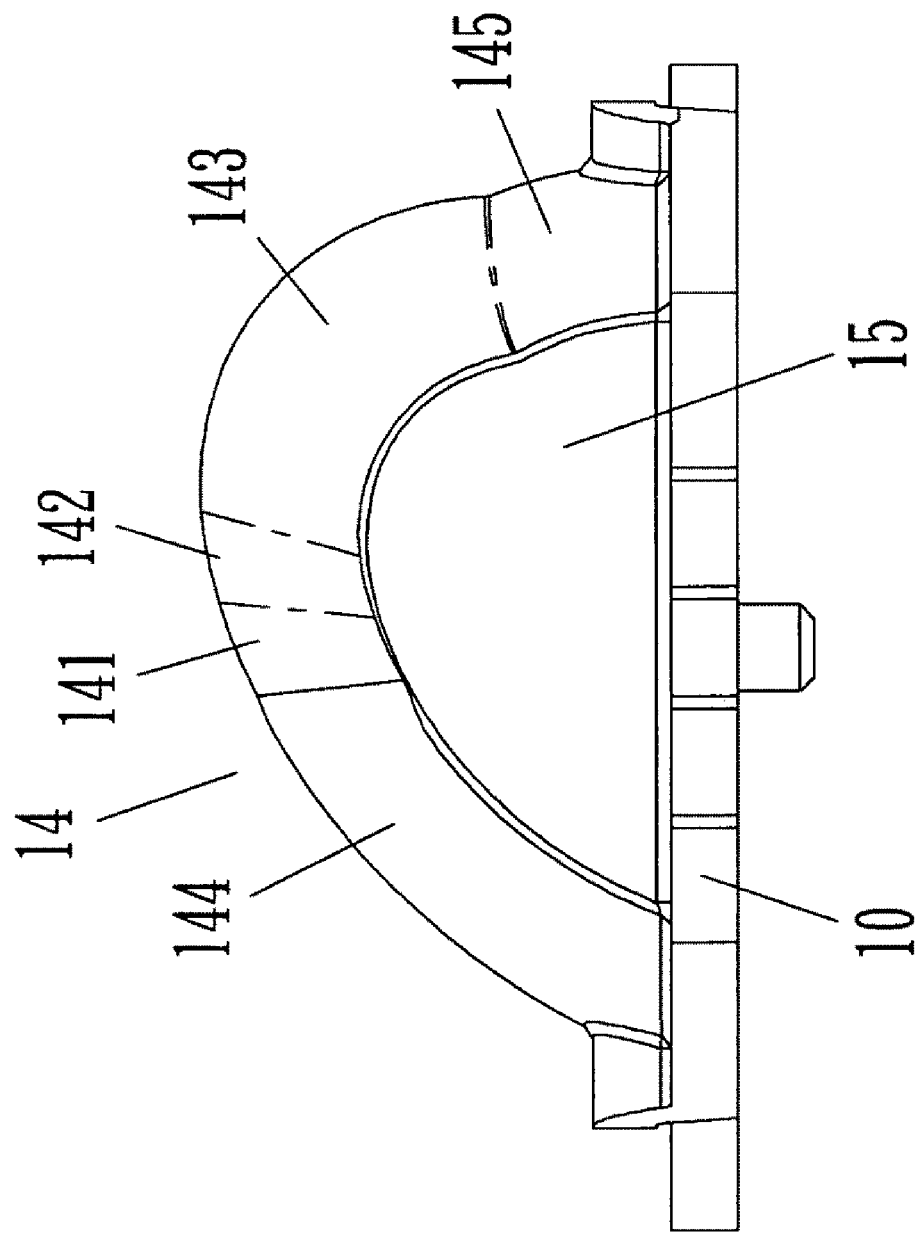
FIG. 6 is a side view of the preferable embodiment of the present invention.
Figure 7:
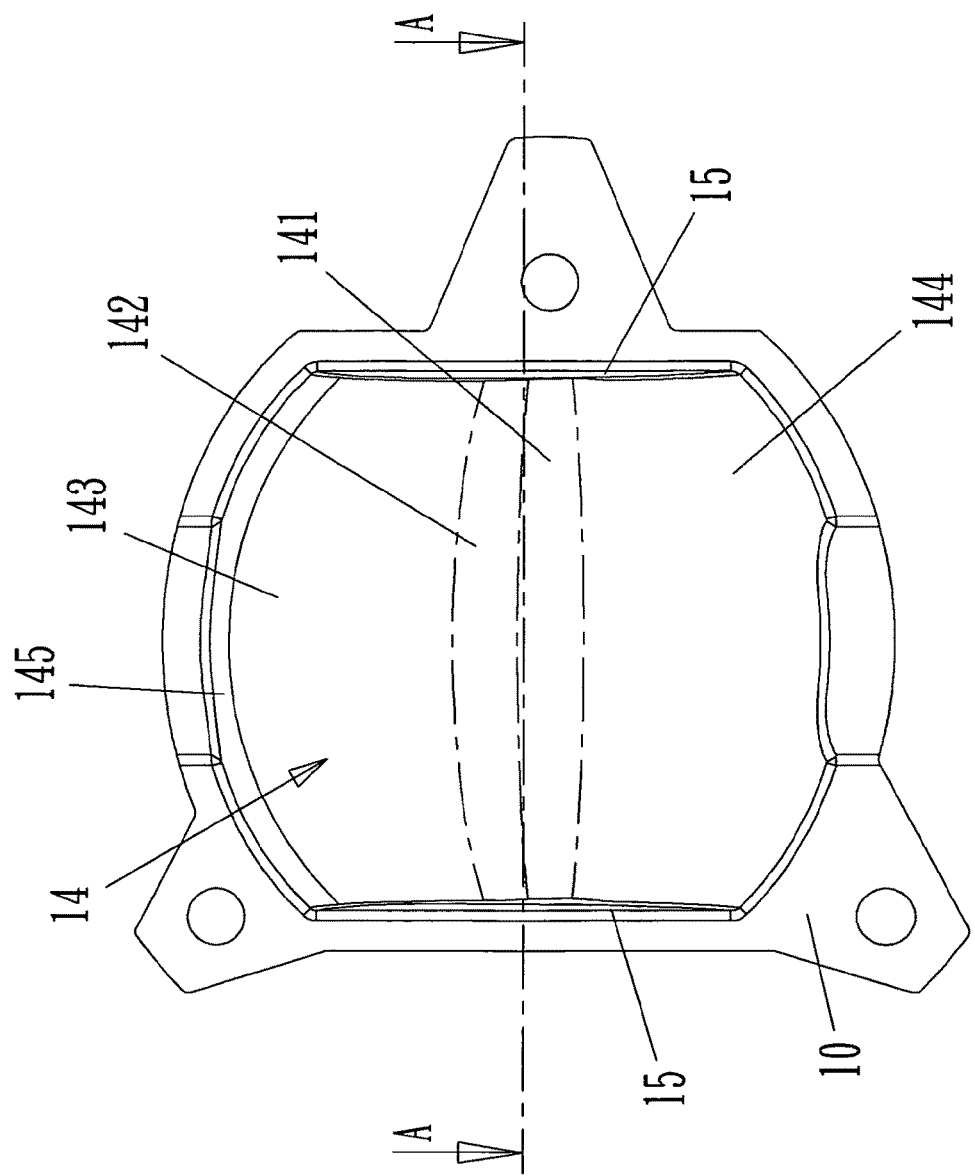
FIG. 7 is a top view of the preferable embodiment of the present invention.
Figure 8:
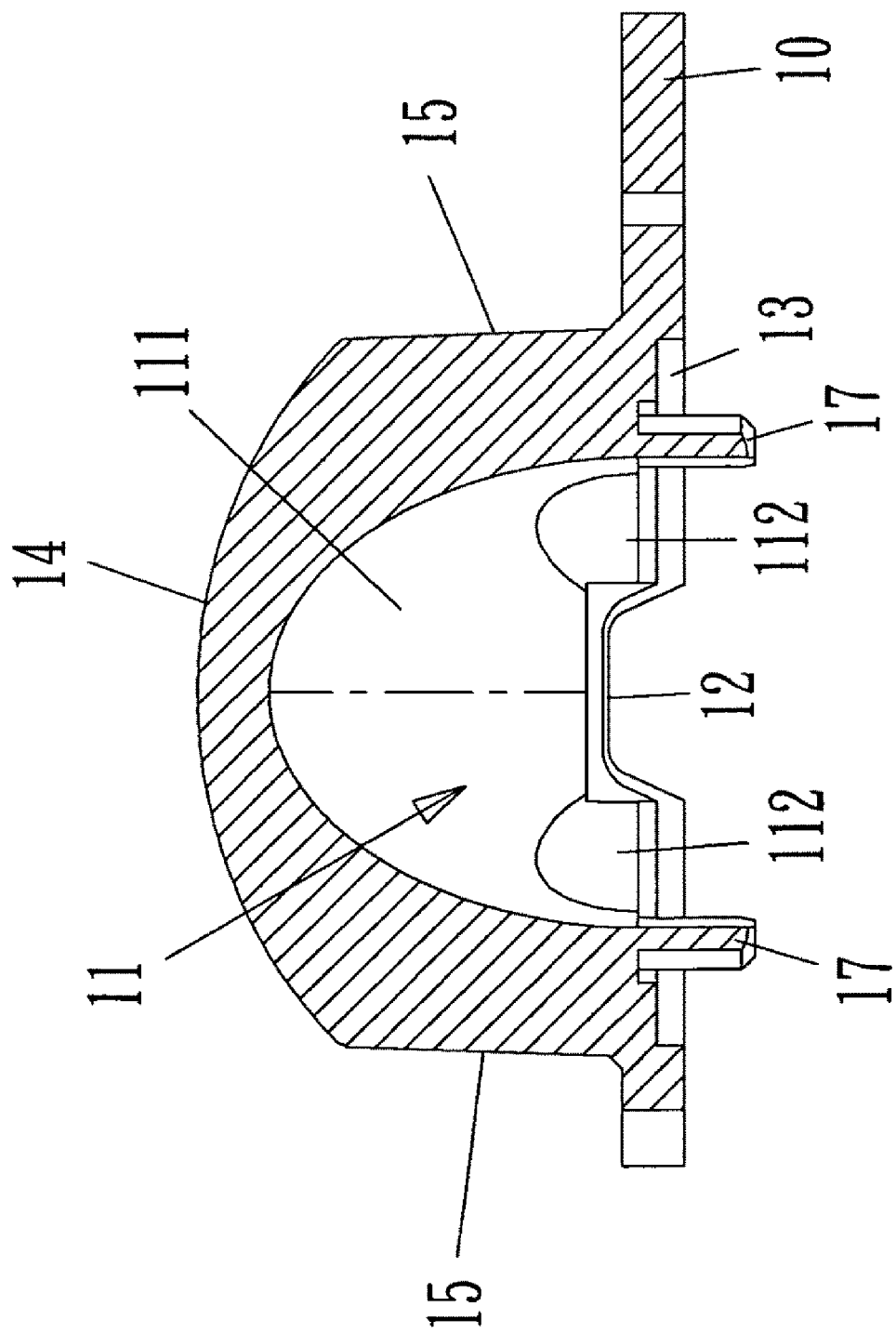
FIG. 8 is a cross section view from an A-A line of FIG. 7.
Figure 9:
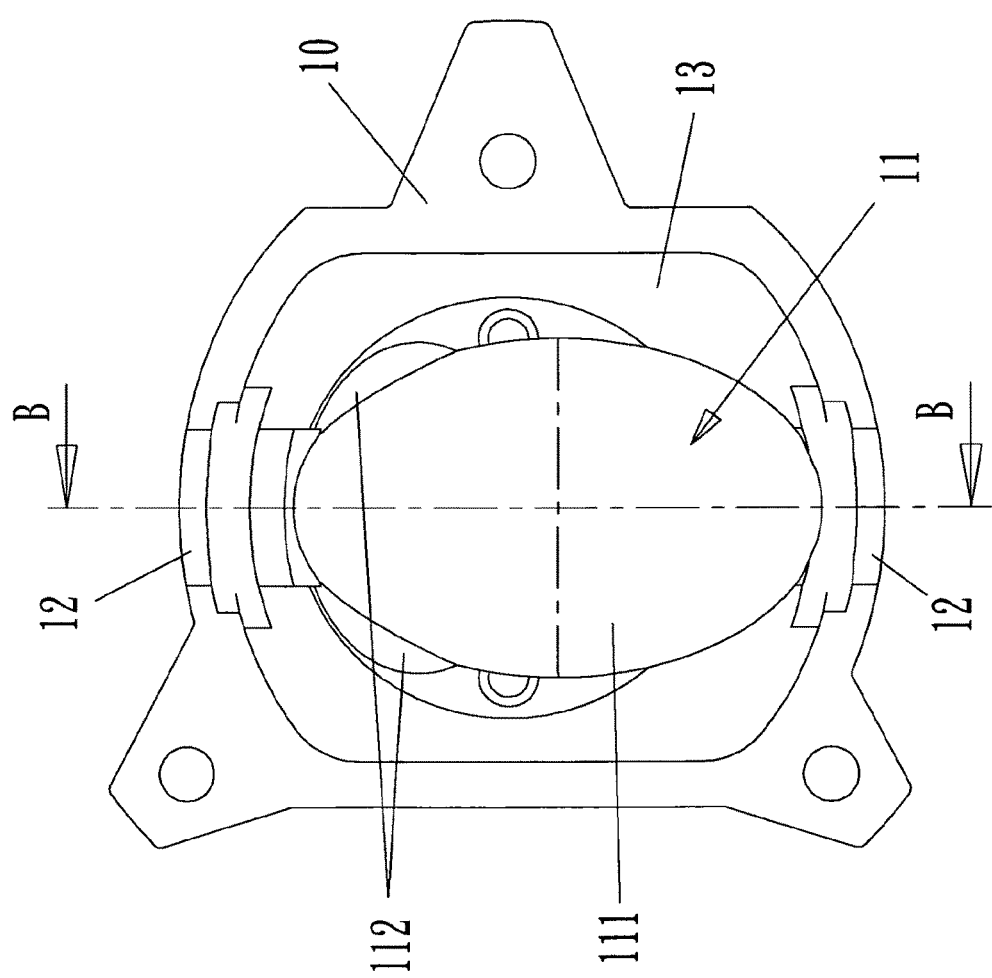
FIG. 9 is an upward view of the preferable embodiment of the present invention.
Figure 10:
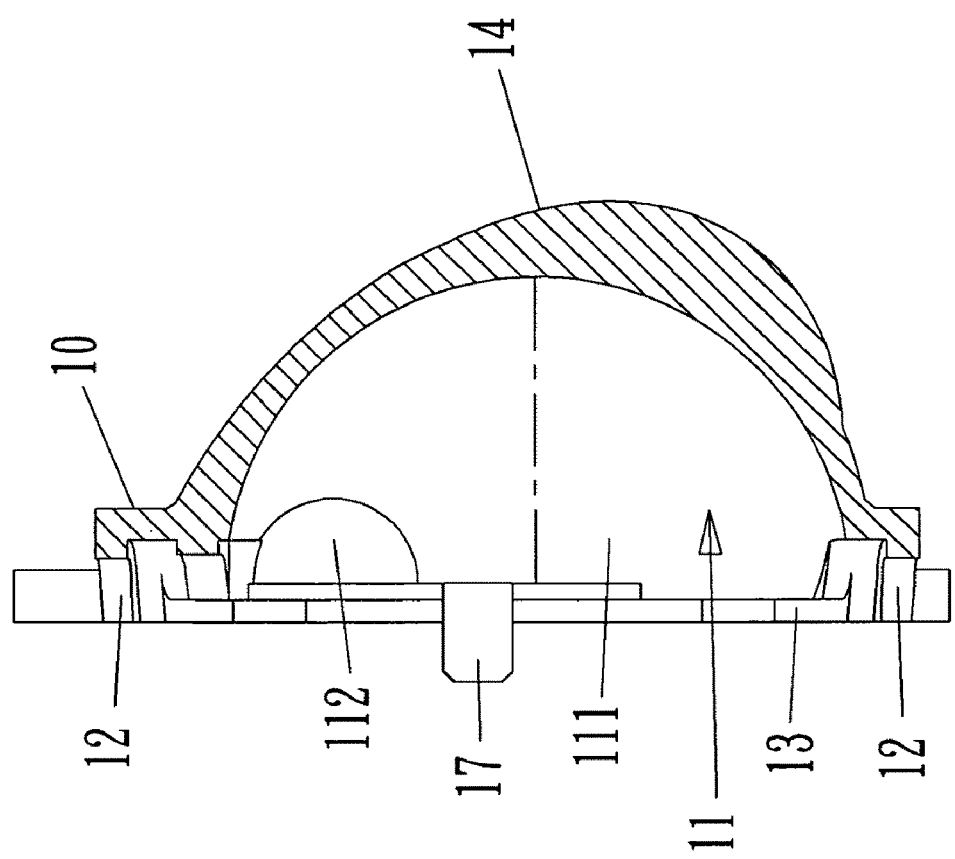
FIG. 10 is a cross section view from a B-B line of FIG. 9.

Referring to FIG. 2, for receiving LED with a diameter larger than 10 mm inside the projection surface 14, the lens assembly of the present invention has a 17.4 mm shorter axis W, 27 mm longer axis L, and a 13.5 mm height of the projection surface 14. Any variations of the dimensions within or above ±2.5 mm should be considered within the spirit and scope of the present invention.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A lens assembly comprising a platform with an incident surface and a projection surface; the incident surface having a main oval-shaped concave surface; the projection surface covering the whole incident surface; the projection surface being formed by a plurality of continuous oval-shaped convex surfaces and discontinuous oval-shaped convex surfaces; the projection surface being symmetric across a longer axis of the incident surface and being asymmetric across a shorter axis of the incident surface, wherein the main oval-shaped concave surface has two symmetric oval-shaped lateral concave surfaces on two lateral sides of an end of the main oval-shaped concave surface.

2. The lens assembly as claimed in claim 1, wherein the incident surface has wire hole on a bottom along a longer axis of the incident surface for wiring.

3. The lens assembly as claimed in claim 1, wherein two symmetric vertical planes are formed to two lateral sides of the projection surface.

4. The lens assembly as claimed in claim 1, wherein the projection surface is formed by a plurality of continuous oval-shaped convex surfaces on a center area and discontinuous oval-shaped convex surfaces outside the continuous oval-shaped convex surfaces.

5. The lens assembly as claimed in claim 1, wherein a cut is formed around the incident surface for receiving a waterproof ring.

6. A lens assembly comprising a platform with an incident surface and a projection surface; the incident surface having a main oval-shaped concave surface; the projection surface covering the whole incident surface; the projection surface being formed by a plurality of continuous oval-shaped convex surfaces and discontinuous oval-shaped convex surfaces; the projection surface being symmetric across a longer axis of the incident surface and being asymmetric across a shorter axis of the incident surface, wherein a cut is formed around the incident surface for receiving a waterproof ring.

7. The lens assembly as claimed in claim 6, wherein the incident surface has wire hole on a bottom along a longer axis of the incident surface for wiring.

8. The lens assembly as claimed in claim 6, wherein two symmetric vertical planes are formed to two lateral sides of the projection surface.

9. The lens assembly as claimed in claim 6, wherein the projection surface is formed by a plurality of continuous oval-shaped convex surfaces on a center area and discontinuous oval-shaped convex surfaces outside the continuous oval-shaped convex surfaces.

* * * * *